(12) United States Patent
Tsujikawa et al.

(10) Patent No.: US 6,656,804 B2
(45) Date of Patent: Dec. 2, 2003

(54) SEMICONDUCTOR DEVICE AND PRODUCTION METHOD THEREOF

(75) Inventors: Shimpei Tsujikawa, Hino (JP); Jiro Yugami, Yokohama (JP); Toshiyuki Mine, Fussa (JP); Masahiro Ushiyama, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/894,132

(22) Filed: Jun. 29, 2001

(65) Prior Publication Data

US 2002/0000628 A1 Jan. 3, 2002

(30) Foreign Application Priority Data

Jun. 30, 2000 (JP) .......................... 2000-203078

(51) Int. Cl.[7] .................. H01L 21/336; H01L 21/31; H01L 21/302
(52) U.S. Cl. .................. 438/287; 438/756; 438/792
(58) Field of Search .................. 438/287, 745, 438/756, 791, 792

(56) References Cited

U.S. PATENT DOCUMENTS 6,150,286 A * 11/2000 Sun et al. .................. 438/791

OTHER PUBLICATIONS

C. G. Parker et al., *IEEE Electron Device Letters*, "Ultrathin Oxide–Nitride Gate Dielectric MOSFET's," 1998, pp. 106–108.

* cited by examiner

*Primary Examiner*—Alexander Ghyka
(74) *Attorney, Agent, or Firm*—Miles & Stockbridge P.C.

(57) ABSTRACT

The present invention provides a MOS semiconductor device which enables gate leakage current reduction with a thinner gate dielectric film for higher speed, and a production method thereof. According to the present invention, a gate dielectric film 6 is made as follows: after forming a silicon nitride film 3 with a specified thickness, it is annealed in an oxidizing atmosphere to form silicon oxide 4 on the silicon nitride film 3, then this silicon oxide 4 is completely removed by exposure to a dissolving liquid. As a result, at depths between 0.12 nm and 0.5 nm from the top surface of the silicon nitride film 3 in the gate dielectric film 6 whose main constituent elements are silicon, nitrogen and oxygen, the nitrogen concentration is higher than the oxygen concentration. This enables the use of a thinner gate dielectric film with silicon, nitrogen and oxygen as main constituent elements while at the same time realizing reduction in leakage currents.

3 Claims, 12 Drawing Sheets

N2O-annealing temperature (°C)

Equivalent oxide thickness (nm)

condition of wet oxidation as thickness of SiO2 formed on Si substrate (nm)

SEMICONDUCTOR DEVICE AND PRODUCTION METHOD THEREOF

BACKGROUND OF THE INVENTION (1) Field of the Invention

The present invention relates to a semiconductor device and a production method thereof, and particularly to a MOS semiconductor device which enables reduction in gate leakage currents with a thinner gate dielectric film, and a production method thereof.

(2) Description of the Prior Art

As a material for gate insulator used in semiconductor devices which use MOS devices, silicon oxide has always been used when the gate dielectric film thickness (equivalent oxide thickness) as calculated based on oxide silicon permittivity is 3 nm or more.

However, as the effort to use a thinner gate dielectric film for higher speed has been accelerated, it has been found that, when its equivalent oxide thickness is 3 nm or less, direct-tunneling leakage current flowing through the dielectric film becomes considerable, resulting in an increase in gate leakage currents which is not negligible from the viewpoint of decreasing power consumption.

To solve this problem, there have been many attempts to reduce such direct tunneling leakage currents by increasing the physical thickness while maintaining the equivalent oxide thickness constant.

For instance, it has been reported on page 106 of IEEE Electron Device Letters Vol. 19 published in 1998 that a gate dielectric film which has a silicon nitride film formed on a thermally oxidized film formed on a silicon substrate or directly on a silicon substrate demonstrates reduced gate leakage currents when compared to oxide silicon film. However, the above-said report also discloses that it is necessary to perform annealing in an oxidizing atmosphere after formation of a silicon nitride film for reduction in leakage currents.

Usually, silicon nitride films are produced by chemical vapor deposition (CVD). It is known that in the silicon nitride film making process, the film contains much hydrogen and a bond of nitrogen and hydrogen serves as a charge trap. Therefore, it has been thought that although direct-tunneling leakage current can be reduced, the current through this charge trap is considerable, which thereby prevents leakage current reduction.

For this reason, it is a very important technique for gate leakage current reduction to decrease the charge trap in the silicon nitride by decreasing the amount of hydrogen in the film by annealing in an oxidizing atmosphere and, at the same time, adding oxygen.

SUMMARY OF THE INVENTION

When a silicon nitride film is formed and then annealed in an oxidizing atmosphere, the charge trap in the silicon nitride decreases and also the surface of the silicon nitride is oxidized, generating a thin silicon oxide film. According to an examination by the inventor, it has been demonstrated that, depending on the annealing condition in the oxidizing atmosphere, if this annealing step is carried out under a condition effective for gate leakage current reduction, a silicon oxide film with a thickness of 0.5 nm or more is formed on the surface of the nitride film. In an area where the equivalent oxide thickness of the gate dielectric film is 3 nm or less, the above-said silicon oxide film formed on the silicon nitride film surface will be a serious barrier to a thinner gate dielectric film.

In view of the above circumstances, the present invention has an object to provide an improved MOS semiconductor device which permits gate leakage current reduction and the use of a thinner gate dielectric film, and a production method thereof.

The semiconductor device which achieves the above object according to the present invention comprises a gate electrode provided through a gate dielectric film on a semiconductor substrate of the first conductive type, and a source and a drain region of the second conductive type which are separated from each other in the semiconductor substrate, wherein the above-said gate dielectric film has an equivalent oxide thickness of 3 nm or less taking the factor of permittivity into consideration, and consists of a dielectric film composed of silicon, nitrogen and oxygen as main constituent elements and also wherein the nitrogen concentration is higher than the oxygen concentration in the region of the gate dielectric film at depths of 0.15 nm to 0.5 nm from the interface with the gate electrode.

The production method for obtaining this semiconductor device is characterized in that some portion of the gate dielectric film making process is composed of the following steps: a step of making a dielectric film whose main constituent elements are silicon and nitrogen; a step of annealing this in an oxidizing atmosphere; and a step of selectively removing the silicon oxide film formed on this dielectric film surface by exposure to a liquid which dissolves the silicon oxide.

This makes it possible to form a gate dielectric film having silicon nitride on the surface of which there is no silicon oxide film with a low permittivity, thereby permitting both a decrease in gate dielectric film thickness (equivalent oxide thickness) and reduction in gate leakage currents.

The silicon oxide film as referred to herein is defined as a silicon oxide film in which the oxygen concentration is higher than the nitrogen concentration in the silicon oxide; the above-mentioned silicon nitride film silicon on the surface of which there is no silicon oxide film with a low permittivity refers to a silicon nitride film in which the nitrogen concentration is higher than the oxygen concentration.

The foregoing and other objects, advantages, manner of operation and novel features of the present invention will be understood from the following detailed description when read in connection with the accompanying drawings.

DESCRIPTION OF THE PREFERRED EMBODIMENTS

Next, the characteristics of the production process for a typical gate dielectric film according to the present invention will be described in detail. It is desirable that for the above-mentioned step of annealing in an oxidizing atmosphere after the silicon nitride deposition, the oxidizing atmosphere is an atmosphere containing $N_2O$, or an atmosphere containing water vapor and oxygen (the process of annealing in this atmosphere is referred to as "wet oxidation").

Furthermore, it is preferable to make a silicon nitride film in the gate dielectric film making process by chemical vapor deposition. Also, in using the chemical vapor deposition method for silicon nitride film formation, it is desirable to use $SiH_4$ and $NH_3$ as source gases. The reason for this is that $SiH_4$ is more thickness-controllable and has a smaller thickness deviation on a wafer than $SiH_2Cl_2$, a gas commonly used for this purpose.

It is also desirable to use an aqueous solution containing HF as a liquid for dissolving the silicon oxide in the gate dielectric film making process.

Preferred embodiments of the present invention will be described below concretely referring to the attached drawings.

Embodiment 1

FIGS. 1A to 1D are sectional views illustrating the structure of a gate dielectric film and the production steps thereof.

Figure 1A:
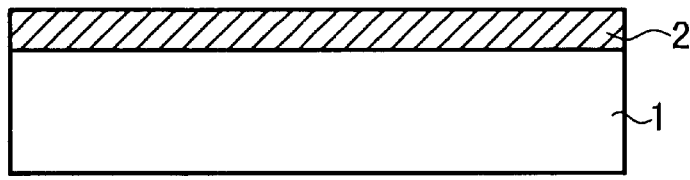
FIGS. 1A to 1D are sectional views illustrating the general structure of a gate dielectric film and the production steps according to a first embodiment of the present invention.

First, as shown in FIG. 1A, after a silicon substrate 1 is immersed in a HF solution, it is heated to 700° C. in a dry oxygen atmosphere to make a 1-nm thick silicon oxide film 2.

Figure 1B:
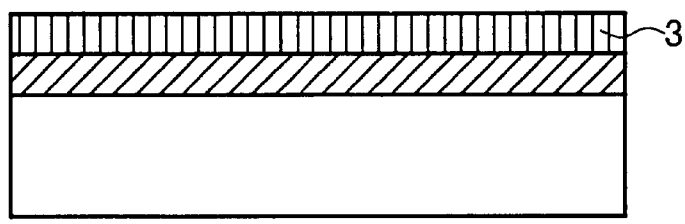

Then, as shown in FIG. 1B, a silicon nitride film 3 with a thickness of 2 nm is deposited by chemical vapor deposition using $SiH_4$ and $NH_3$ as source gases. This 2-nm thick silicon nitride film 3 corresponds to an equivalent oxide thickness of 1 nm. As source gases used for depositing a silicon nitride film by chemical vapor deposition, a combination of $SiH_2Cl_2$ and $NH_3$ is typically used; however, a combination of $SiH_4$ and $NH_3$ is better in thickness controllability than that combination.

Figure 1C:
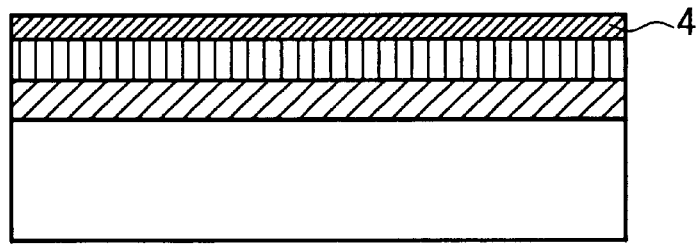

Next, as shown in FIG. 1C, the silicon nitride film 3 once deposited is annealed in a $N_2O$ atmosphere; during this process, a thin silicon oxide film 4 is formed on the surface of the silicon nitride film 3. The equivalent oxide thickness of the gate dielectric film can be made a desired thickness mainly by varying the deposition thickness of the silicon nitride film 3; and it can also vary several angstroms depending on the annealing condition under which annealing in a $N_2O$ atmosphere is done after the deposition of the silicon nitride film 3.

The result is the same even when annealing is done in an atmosphere containing water vapor and oxygen (this process is hereinafter called "wet oxidation") instead of in a $N_2O$ atmosphere.

Figure 1D:
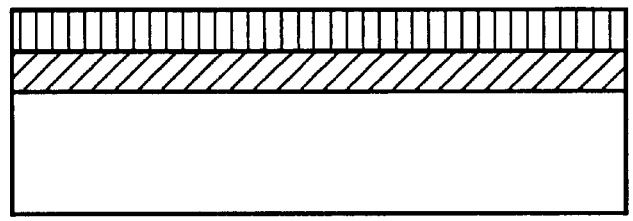

Then, as shown in FIG. 1D, the substrate is immersed in a HF solution diluted with water at a weight ratio of 1:800 to remove the silicon oxide film 4 formed on the surface of the silicon nitride 3 to make a gate dielectric film 6. The diluted HF solution selectively removes only the silicon oxide film 4 since the silicon nitride 3 serves as an etching stopper.

In this way, a gate dielectric film 6 (which corresponds to 2 nm equivalent oxide thickness) is produced in which there is a 2-nm thick deposition of silicon nitride 3 (which corresponds to 1 nm equivalent oxide thickness) on the silicon oxide film 2 whose thickness is 1 nm.

Since the top surface of the silicon nitride 3 after removal of the silicon oxide film 4 adsorbs oxygen from the atmospheric air, the nitrogen concentration is not always higher than the oxygen concentration there. However, the nitrogen concentration is higher than the oxygen concentration at least at depths of 0.15 nm to 0.5 nm from the surface.

In the prior art which is compared with the present invention's technique, the step of dissolving the silicon oxide film 4 with a HF solution as mentioned above is not taken.

When the technique according to the present invention is used, the thickness of the gate dielectric film can be decreased by the amount equal to the thickness of the silicon oxide film 4 which is dissolved away at the final step of the gate dielectric film making process. In the experiment conducted by the inventor, when annealing was done at 800° C. in a $N_2O$ atmosphere after the deposition of the silicon nitride film 3, the decrease in the gate dielectric film thickness was 0.6 nm. This means that a silicon oxide film 4 with a thickness of 0.6 nm was formed on the silicon nitride film 3 under this specific condition for annealing in an oxidizing atmosphere.

A description of a typical production process for the gate dielectric film 6 and the structure of the gate dielectric film 6 according to the present invention has been given above.

Next, in order to evaluate the characteristics of gate dielectric films formed using the present invention's technique and the prior art when they are mounted in devices, an embodiment for making an n-channel MOS transistor will be explained by reference to FIG. 2.

Figure 2:
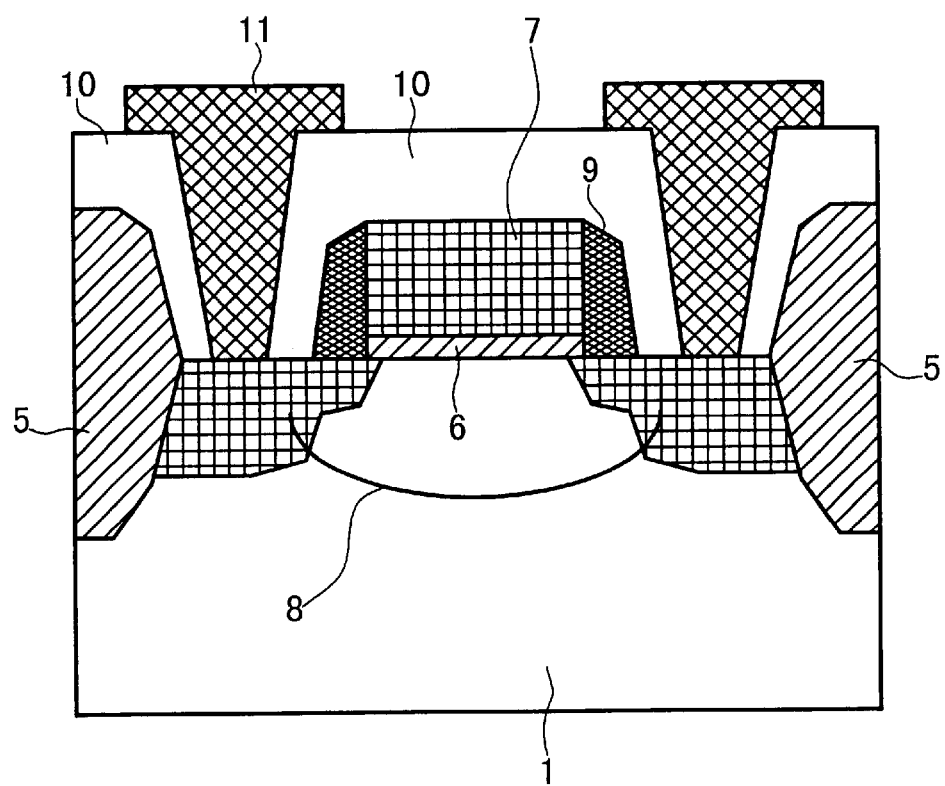
FIG. 2 is a sectional view illustrating the structure of a semiconductor device fabricated using the present invention's technique.

FIG. 2 is a sectional view illustrating a MOS device type semiconductor device.

Here, a silicon substrate 1 is a p-type substrate. After an isolation layer 5 is formed on its surface using the known selective oxidation method, a gate dielectric film 6 is made and an amorphous silicon layer with a thickness of 200 nm containing phosphorus with a concentration of $3\times10^{20}$ cm$^{-3}$ is deposited thereon by the known chemical vapor deposition method using $SiH_4$ and $PH_3$ as source gases and this is scaled to the desired size by photolithography and dry etching to make a gate electrode 7.

Here, a low-concentration region is made in a diffusion layer 8 by ion-implantation of arsenic. Next, a silicon oxide film (100 nm) is made using $SiH_4$ and $N_2O$ by chemical vapor deposition, followed by anisotropic etching of this layer to make sidewalls 9 of silicon oxide. At this time, a high-concentration region is made in the diffusion layer by ion-implantation of phosphorous.

Then, the implanted arsenic and phosphorous are electrically activated by annealing at 950° C. After annealing, a silicon oxide film is deposited by chemical vapor deposition using $SiH_4$ and $N_2O$; likewise, a silicon oxide film containing boron and phosphorous is deposited by chemical vapor deposition using $SiH_4$, $B_2H_6$, $PH_3$ and $O_2$, which is followed by annealing for smoothening to make an inter-layer insulator film 10.

Contact holes are made in the inter-layer insulator film 10 by photolithography and dry etching; by chemical vapor deposition and sputtering, tungsten is deposited so as to fill the contact holes; then this is processed by photolithography and dry etching to make wiring 11.

Figure 3:
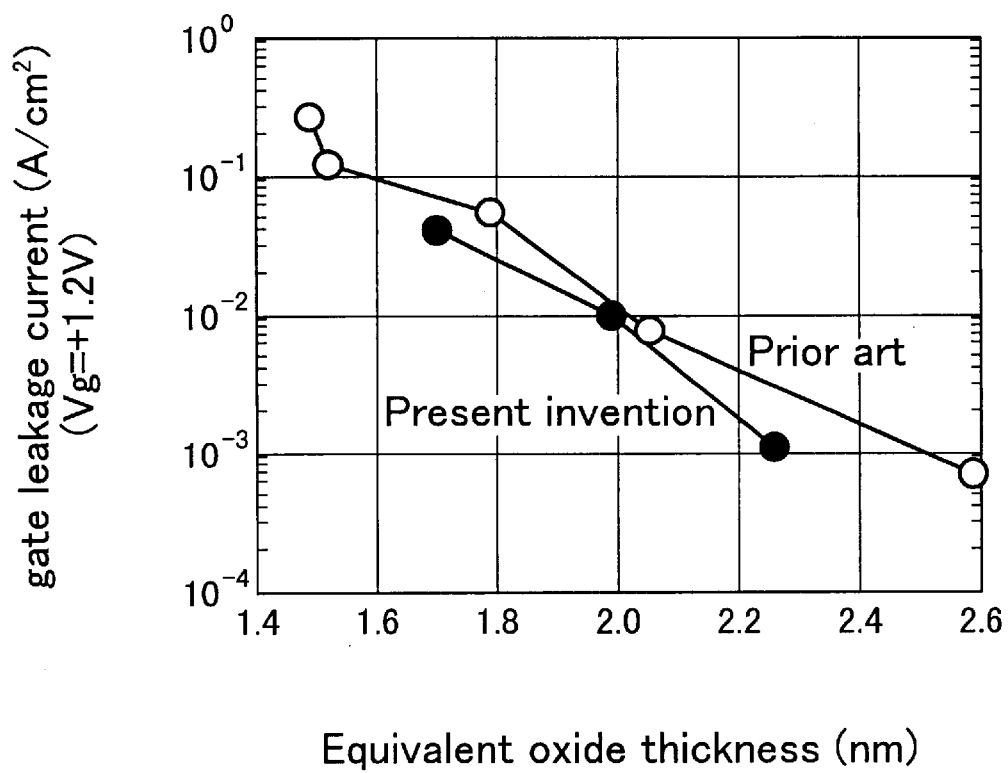
FIG. 3 is a characteristic graph showing comparison of gate leakage currents in the gate dielectric film as the first embodiment of the present invention against those in the prior art.

By taking all the steps as mentioned above, an n-channel MOS transistor as shown in FIG. 2 is completed. FIG. 3 shows the relationship between the gate leakage current and the equivalent oxide thickness of the gate dielectric film when +1.2 V is applied to the gate electrode 7 in the MOS transistor thus made, which has a gate width of 15 $\mu$m and a gate length of 4 $\mu$m. The graph suggests that, when the thin silicon oxide film formed on the silicon nitride film 3 is removed according to the present invention, the leakage current is approx. 70% of that according to the prior art, where the equivalent oxide thickness is identical.

Figure 4:
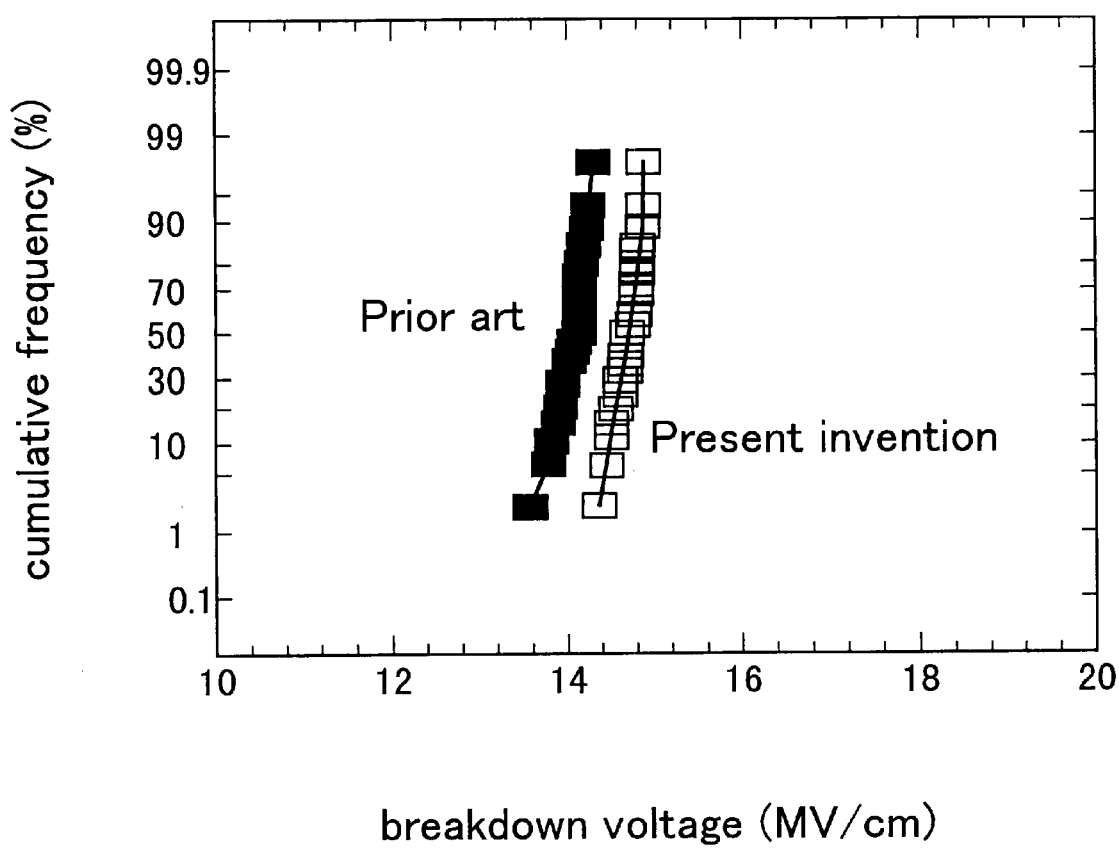
FIG. 4 is a characteristic graph showing comparison of breakdown voltage distribution in the gate dielectric film as the first embodiment of the present invention against that in the prior art.

FIG. 4 shows the distribution of plotted breakdown voltage measurements where a positive bias is applied to the gate electrode of another MOS transistor completed at the same time, the gate width and gate length of which are both 100 $\mu$m. From this graph, it is known that the breakdown voltages in the present invention are higher than those in the prior art, which means an improvement in breakdown voltage.

Hence, it is apparent that when the technique according to the present invention is employed, there is no significant deviation in the gate breakdown voltage distribution and also there is no problem in terms of gate dielectric film defect density.

It has been believed so far that exposure to a dissolving solution during the gate dielectric film making process is not desirable because the gate dielectric film defect density increases. In the experiment, however, any increase in the defect density was not observed when the present invention's technique was employed. This may be because a HF solution is slow in dissolving the silicon nitride 3.

As discussed above, it has been demonstrated that when the present invention's technique is employed, a thinner gate dielectric film can be used and the gate leakage currents are reduced without any increase in the gate dielectric film defect density.

Figure 5:
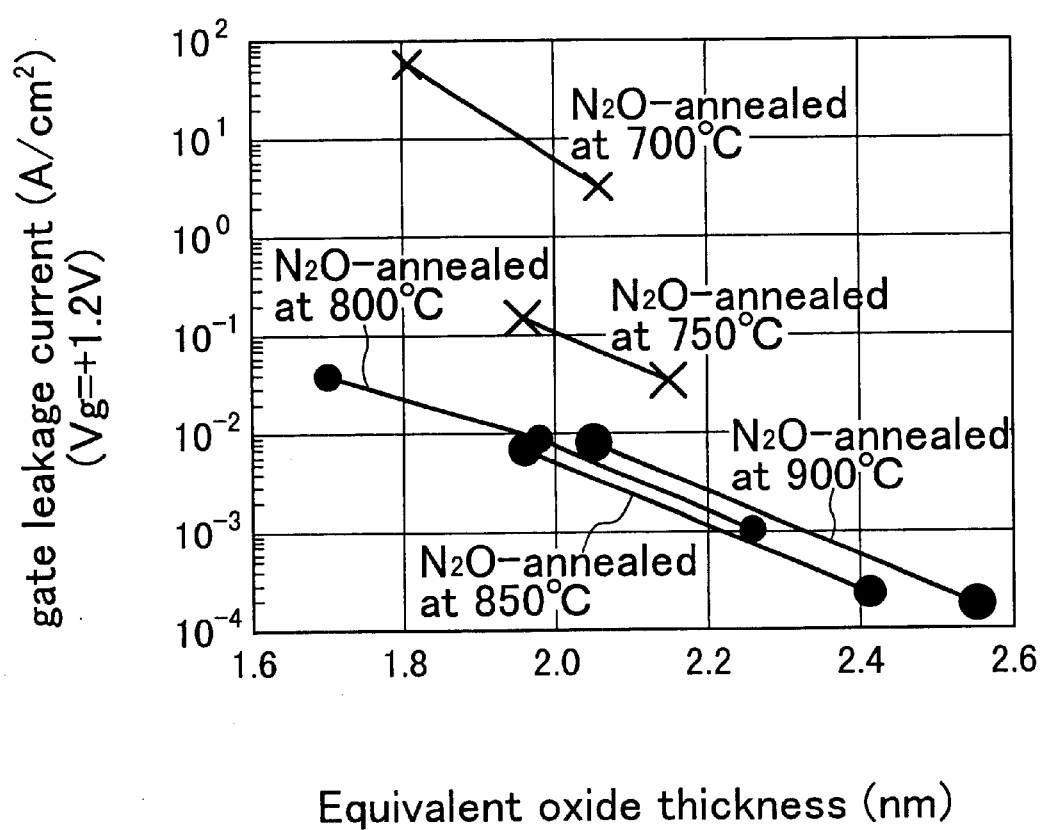
FIG. 5 is a characteristic graph showing the relationship between the annealing temperature in a $N_2O$ atmosphere and the gate leakage current in the first embodiment of the present invention.

FIG. 5 compares the results of gate leakage current measurements at different annealing temperatures where annealing was done in a $N_2O$ atmosphere after deposition of the silicon nitride film 3. The graph indicates that annealing temperatures of 800° C. or more are preferable for gate leakage current reduction; the gate leakage currents as a result of annealing at 700° C. are larger by over two digits than those as a result of annealing at 800° C.

Regarding the annealing temperature, a lower temperature is preferable as far as the intended effect of gate leakage current reduction is achieved. Hence, in this case, when the annealing temperature is between 800° C. and 850° C., the effect of leakage current reduction is sufficient. Generally, annealing at a high temperature might affect the electrical characteristics of devices unfavorably so the use of an annealing temperature higher than necessary should be avoided.

Figure 6:
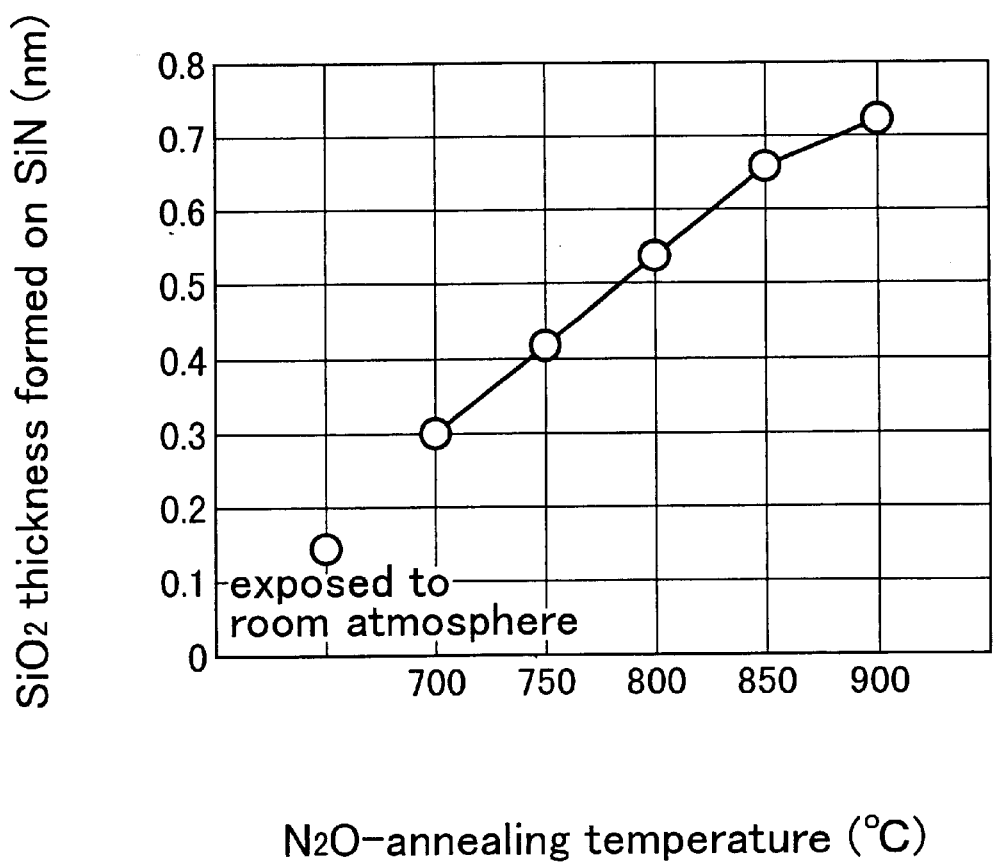
FIG. 6 is a characteristic graph showing the relationship between the annealing temperature in a $N_2O$ atmosphere and the thickness of the silicon oxide formed on the silicon nitride in the first embodiment of the present invention.

FIG. 6 shows how the thickness of the silicon oxide film 4 formed on the silicon nitride film 3 depends on the temperature of annealing in a $N_2O$ atmosphere as mentioned above. The graph also shows the thickness of the silicon oxide film 4 formed on the silicon nitride 3 where the substrate is exposed to the room atmosphere for two hours without being annealed in a $N_2O$ atmosphere.

Here, the thickness of the silicon oxide film 4 is defined as the thickness of the region whose oxygen atom concentration was found to be higher than the nitrogen atom concentration by analysis based on a combination of wet etching and X-ray photoelectron spectroscopy (XPS). The graph reveals that when annealing in a $N_2O$ atmosphere effective for gate leakage current reduction is done, or when the temperature of annealing in a $N_2O$ atmosphere is 800° C. or more, the thickness of the silicon oxide film 4 formed on the silicon nitride film 3 is 0.5 nm or more.

When the silicon nitride film 3 was left exposed to the atmospheric air, the thickness of the silicon oxide film formed on its surface was 0.15 nm. Therefore, it can be concluded that in the structure of a semiconductor device according to the present invention, the nitrogen concentration is higher than the oxygen concentration in the gate dielectric film's region at depths of 0.15 nm to 0.5 nm from its interface with the gate electrode.

Embodiment 2

Figure 7A:
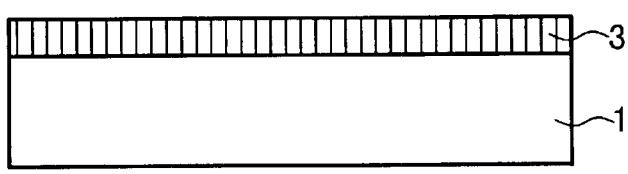
FIGS. 7A to 7B and 7C are sectional views illustrating the structure of a gate dielectric film and the production steps according to a second embodiment of the present invention.
Figure 7B:
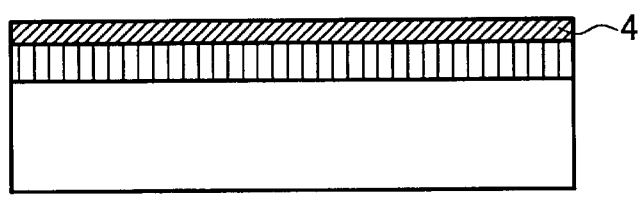
Figure 7C:
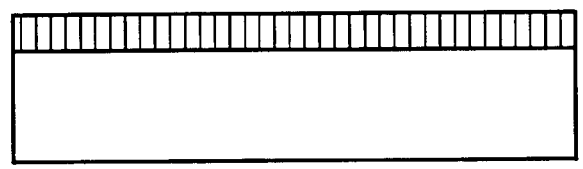

A second embodiment of the present invention will be described referring to FIGS. 7A to 7C. FIGS. 7A to 7C are sectional views illustrating the structure of a gate dielectric film and production steps thereof. As shown in FIG. 7A, after the silicon substrate 1 is immersed in a HF solution and surface-cleaned, a silicon nitride film 3 is deposited by chemical vapor deposition using $SiH_4$ and $NH_3$ as source gases.

Next, as shown in FIG. 7B, a thin silicon oxide film 4 is formed on the surface of the silicon nitride film 3 by wet oxidation at 800° C. The equivalent oxide thickness of the gate dielectric film can be made a desired thickness mainly by varying the deposition thickness of the silicon nitride film 3; and it can also vary several angstroms depending on the condition of wet oxidation after the deposition of the silicon nitride film 3. Here, the result is the same even when annealing in a $N_2O$ atmosphere is done as in embodiment 1 instead of wet oxidation.

Then, as shown in FIG. 7C, the substrate is immersed in a HF solution diluted with water at a weight ratio of 1:800 to remove the silicon oxide film 4 formed on the surface of the silicon nitride to make a gate dielectric film.

In the prior art which is compared with the present invention's technique, the step of dissolving the silicon oxide film 4 with a HF solution as mentioned above is not taken. When the technique according to the present invention is employed, the thickness of the gate dielectric film can be decreased by the amount equal to the thickness of the silicon oxide film 4 which is dissolved away at the final step of the gate dielectric film making process.

When wet oxidation was done at 800° C. after the deposition of the silicon nitride film 3 and a 15-nm thick silicon oxide film was formed, the gate dielectric film thickness was decreased by 0.6 nm as the effect of the present invention.

In order to evaluate the characteristics of gate dielectric films formed using the present invention's technique and the prior art when they are actually mounted in devices, p-channel MOS transistors were fabricated. This embodiment will also be explained by reference to the sectional view in FIG. 2, in the same way as embodiment 1, though it should be noted that this embodiment relates to p-channel MOS transistors while embodiment 1 relates to n-channel MOS transistors.

The silicon substrate 1 used here is an n-type substrate. After isolation layers 5 are formed on the surface of the substrate using the known selective oxidation method, a gate dielectric film 6 is formed and a polycrystalline silicon layer with a thickness of 200 nm is deposited thereon by the known chemical vapor deposition method using $SiH_4$ as a source gas, followed by $4 \times 10^{15}/cm^2$ boron ion-implantation with an energy of 10 keV; before this is scaled to the desired size by photolithography and dry etching to make a gate electrode 7.

Here, a low-concentration region is made in a diffusion layer 8 by ion-implantation of boron. Next, a silicon oxide film (100 nm) is formed by chemical vapor deposition using $SiH_4$ and $N_2O$ and then sidewalls 9 of silicon oxide are formed by anisotropic dry etching of this layer. At this time, a high-concentration region is made in the diffusion layer 8 by ion-implantation of boron.

Then, the implanted boron in the diffusion layer 8 is electrically activated by annealing at 950° C. After annealing, a silicon oxide film is formed by chemical vapor deposition using $SiH_4$ and $N_2O$; likewise, a silicon oxide film containing boron and phosphorous is formed by chemical vapor deposition using $SiH_4, B_2H_6, PH_3$ and $O_2$, which is followed by annealing for smoothening to make an inter-layer insulator film 10.

Contact holes are made in the inter-layer insulator film 10 by photolithography and dry etching; by chemical vapor deposition and sputtering, tungsten is deposited so as to fill the contact holes; then this is processed by photolithography and dry etching to make wiring 11. By taking all the steps as mentioned above, a p-channel MOS transistor as shown in FIG. 2 is completed.

Figure 8:
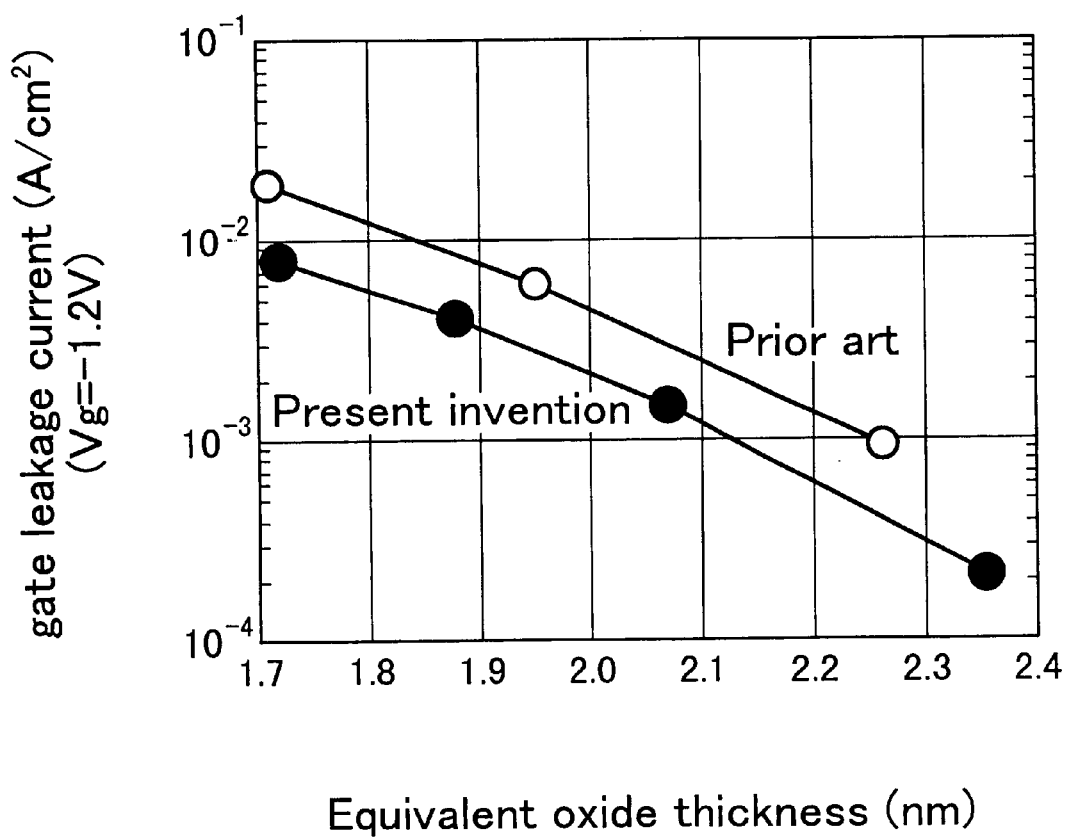
FIG. 8 is a characteristic graph showing comparison of leakage currents in the gate dielectric film as the second embodiment of the present invention against those in the prior art.

FIG. 8 shows the relationship between the gate leakage current and the equivalent oxide thickness of the gate dielectric film when -1.2 V is applied to the gate electrode 7 in the MOS transistor which has a gate width of 15 μm and a gate length of 4 μm. The graph suggests that, when the thin silicon oxide film 4 formed on the silicon nitride film 3 is removed according to the present invention, the leakage currents are approx. 50% of those in the prior art where the equivalent oxide thickness is identical.

Figure 9:
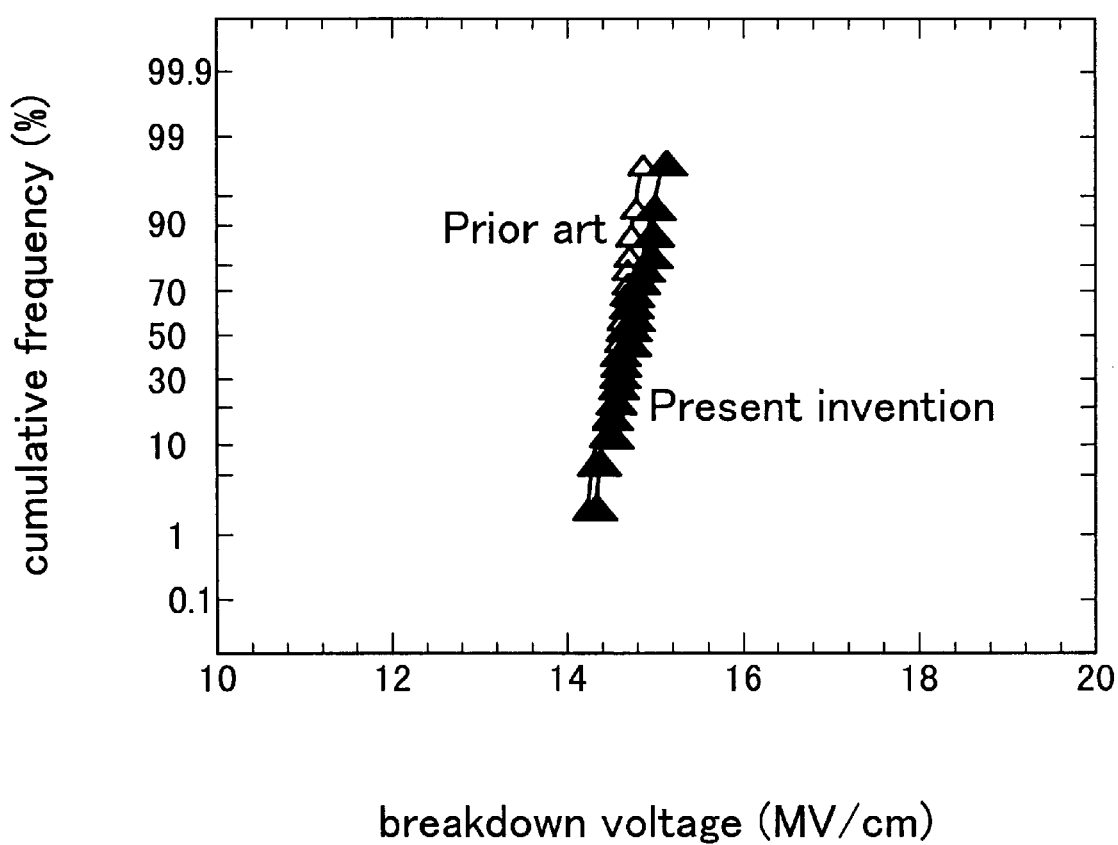
FIG. 9 is a characteristic graph showing comparison of breakdown voltage distribution in the gate dielectric film as the second embodiment of the present invention against that in the prior art.

FIG. 9 shows the distribution of plotted breakdown voltage measurements where a negative bias is applied to the gate electrode of another MOS transistor completed at the same time, the gate width and gate length of which were both 100 μm. From this graph, it is apparent that when the technique according to the present invention is employed, there is no significant deviation in the breakdown voltage distribution and there is no problem in terms of gate dielectric film defect density.

As discussed above, it has been demonstrated that when the present invention's technique is employed, a thinner gate dielectric film can be used and the gate leakage currents are reduced without any increase in the gate dielectric film defect density.

Figure 10:
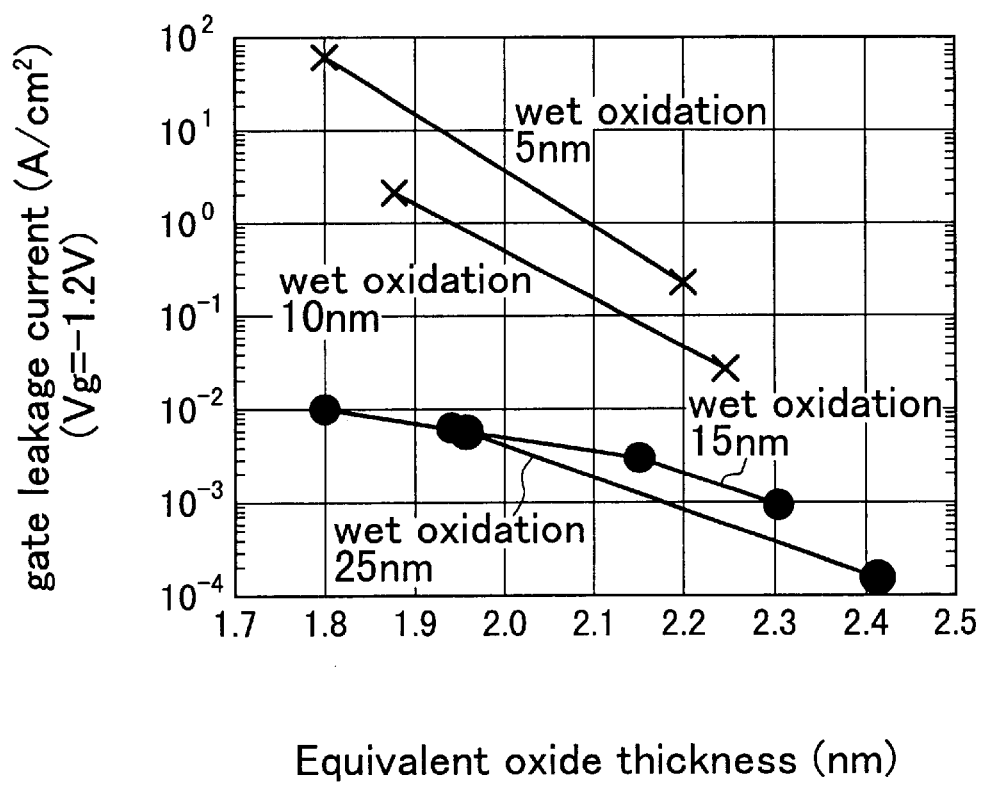
FIG. 10 is a characteristic graph showing the relationship between the condition of wet oxidation after silicon nitride deposition and the gate leakage current in the second embodiment of the present invention.

FIG. 10 compares the results of gate leakage current measurements at different conditions of wet oxidation after deposition of the silicon nitride layer 3. The graph indicates that a wet oxidation condition which allows the formation of an oxide layer of 15 nm or more is effective for gate leakage current reduction.

Figure 11:
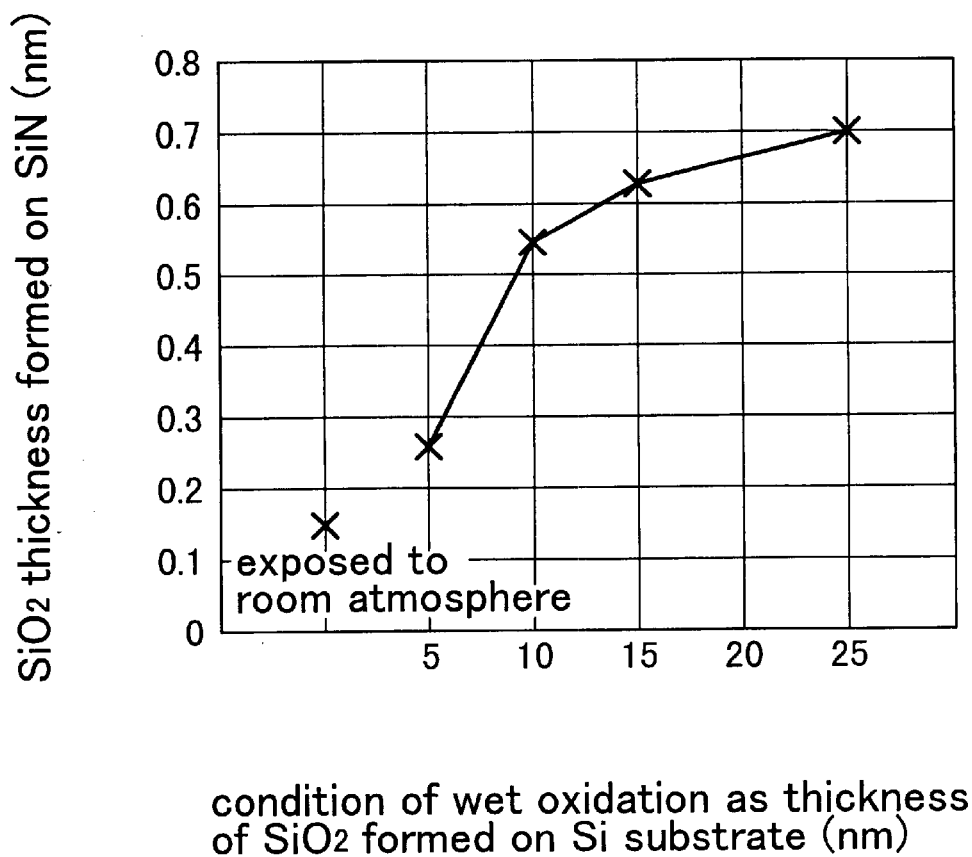
FIG. 11 is a characteristic graph showing the relationship between the thickness of the silicon oxide formed on the silicon nitride by wet oxidation after silicon nitride deposition and the wet oxidation condition in the second embodiment of the present invention.

FIG. 11 shows how the thickness of the silicon oxide film 4 formed on the silicon nitride film 3 depends on the condition of wet oxidation. The graph also shows the thickness of the silicon oxide film 4 formed on the silicon nitride film 3 where the substrate is exposed to the room atmosphere for two hours without being subjected to wet oxidation.

The graph reveals that when wet oxidation which is effective for gate leakage current reduction is performed, or when a silicon oxide film with a thickness of over 15 nm is formed by wet oxidation, the thickness of the silicon oxide film 4 formed on the silicon nitride film 3 is 0.6 nm or more.

When the silicon nitride film 3 was left exposed to the atmospheric air, the thickness of the silicon oxide film formed on its surface was 0.15 nm. Therefore, it can be concluded that in the structure of a semiconductor device according to the present invention, the nitrogen concentration is higher than the oxygen concentration in the gate dielectric film's region at depths of 0.15 nm to 0.6 nm from its interface with the gate electrode.

Also, taking the effect brought by the structure of embodiment 1 into consideration, it can be concluded that in the structure of a semiconductor device according to the present invention, the nitrogen concentration is higher than the oxygen concentration in the gate dielectric film's region at depths of 0.15 nm to 0.5 nm from its interface with the gate electrode.

Embodiment 3

A third embodiment of the present invention will be described referring to FIGS. 7A to 7C. FIGS. 7A to 7C are sectional views illustrating the structure of a gate dielectric film and the production steps thereof. As shown in FIG. 7A, after the silicon substrate 1 is immersed in a HF solution and surface-cleaned, annealing is done at 800° C. in a $NH_3$ gas atmosphere for ten minutes, then a silicon nitride film 3 with a thickness of 3 nm is formed by chemical vapor deposition using $SiH_4$ and $NH_3$ as source gases.

Then, comparison is made between two approaches intended to reduce gate leakage currents: one is based on annealing in a $N_2O$ atmosphere and the other on wet oxidation. Here, in the former approach, annealing is done at 900° C. for ten minutes. In the latter approach, the wet oxidation condition is designed to form a silicon oxide film with a thickness of 10 nm on the silicon substrate in order to ensure that the equivalent oxide thickness of the gate dielectric film is identical between the two approaches. As shown in FIG. 7B, a thin silicon oxide film 4 is formed on the surface of the silicon nitride film 3 by performing annealing in a $N_2O$ atmosphere or wet oxidation as stated above. Then, as shown in FIG. 7C, the substrate is immersed in a HF solution diluted with water at a weight ratio of 1:800 to remove the silicon oxide film 4 formed on the surface of the silicon nitride to make a gate dielectric film.

In order to evaluate the characteristics of gate dielectric films formed using the present invention's technique and the prior art when they are actually mounted in devices, n-channel MOS transistors were fabricated. The production process was completely the same as that used for embodiment 1 except the gate dielectric film making process.

Figure 12:
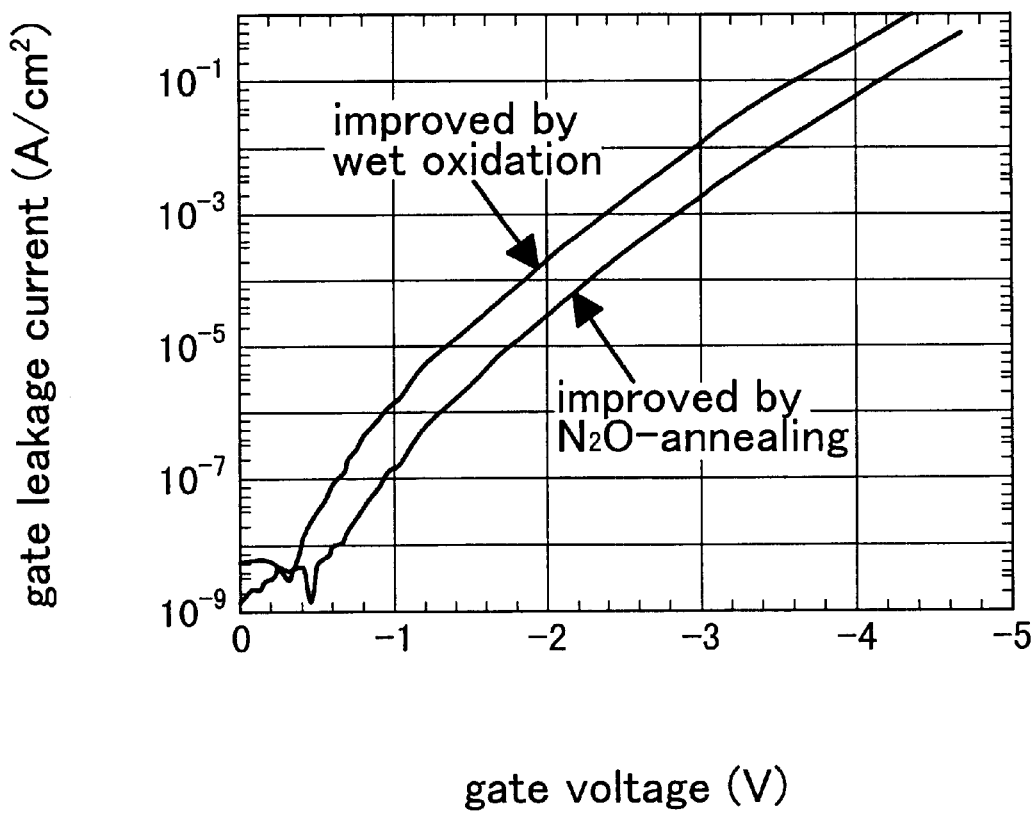
FIG. 12 is a characteristic graph showing the gate leakage current characteristics in the deposited silicon nitride film improved by annealing in a $N_2O$ atmosphere and the one improved by wet oxidation according to a third embodiment of the present invention.

FIG. 12 shows the gate leakage current characteristics where a negative bias is applied to the gate electrode 7 in the MOS transistor which has a gate width of 15 $\mu$m and a gate length of 4 $\mu$m. The graph suggests that, in comparison between the two approaches of annealing for gate leakage current reduction, or annealing in a $N_2O$ atmosphere and wet oxidation, the gate leakage current level in the former approach is approximately one digit smaller than that in the latter approach. Therefore, for the purpose of gate leakage current reduction, annealing in a $N_2O$ atmosphere is more effective than wet oxidation as the improvement process to be followed after the deposition of the silicon nitride film.

As detailed above, the present invention achieves the object of gate leakage current reduction with a thinner gate dielectric film. In other words, the use of a thinner gate dielectric film whose main constituent elements are silicon, nitrogen and oxygen becomes possible while leakage currents are reduced.

What is claimed is:

1. A production method for a semiconductor device comprising a gate electrode provided through a gate dielectric film on a semiconductor substrate of the first conductive type, and a source and a drain region of the second conductive type which are separated from each other, the method comprising:

a first step of forming a silicon nitride film on the semiconductor substrate;

a subsequent second step of annealing in an oxidizing atmosphere;

a third step of selectively removing silicon oxide formed on the surface of the silicon nitride by the above-said second step of annealing in an oxidizing atmosphere, by exposure to a liquid for dissolving the silicon oxide; and a fourth step of forming the gate electrode on the silicon nitride film, wherein the gate dielectric film is formed between the semiconductor substrate and the gate electrode by the first, second and third steps.

2. The semiconductor device production method as defined in claim wherein $SiH_4$ and $NH_3$ are used as source gases when the silicon nitride film is formed by chemical vapor deposition at the first step.

3. The semiconductor device production method as defined in claim 1, wherein, at the second step of annealing in an oxidizing atmosphere after the first step of forming a silicon nitride film, annealing is done in an atmosphere containing $N_2O$ or an atmosphere containing water vapor and oxygen.

* * * * *